United States Patent
Basker et al.

(10) Patent No.: US 10,396,069 B2
(45) Date of Patent: *Aug. 27, 2019

(54) APPROACH TO FABRICATION OF AN ON-CHIP RESISTOR WITH A FIELD EFFECT TRANSISTOR

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/846,887

(22) Filed: Dec. 19, 2017

(65) Prior Publication Data

US 2018/0204834 A1 Jul. 19, 2018

Related U.S. Application Data

(63) Continuation of application No. 15/407,592, filed on Jan. 17, 2017, now Pat. No. 9,917,082.

(51) Int. Cl.
*H01L 27/06* (2006.01)
*H01L 49/02* (2006.01)
(Continued)

(52) U.S. Cl.
CPC .. *H01L 27/0629* (2013.01); *H01L 21/823431* (2013.01); *H01L 21/823437* (2013.01);
(Continued)

(58) Field of Classification Search
None
See application file for complete search history.

(56) References Cited

U.S. PATENT DOCUMENTS 5,888,875 A 3/1999 Lasky
7,087,978 B1 8/2006 Taylor
(Continued)

FOREIGN PATENT DOCUMENTS

WO 2015195109 A1 12/2015

OTHER PUBLICATIONS

List of IBM Patents or Patent Applications Treated as Related dated Dec. 19, 2017, 2 pages.
(Continued)

*Primary Examiner* — Asok K Sarkar
(74) *Attorney, Agent, or Firm* — Tutunjian & Bitetto, P.C.; Vazken Alexanian

(57) ABSTRACT

A method of forming a resistor adjacent to a fin field effect transistor on a substrate, including, forming a plurality of vertical fins on the substrate, forming a dielectric fill layer on the plurality of vertical fins, forming at least two dummy gate structures on the plurality of vertical fins, forming a replaceable resistor structure on the dielectric fill layer over a region of the substrate unoccupied by vertical fins, forming a sidewall spacer on the at least two dummy gate structures and the replaceable resistor structure, removing the replaceable resistor structure to form a trench, and forming a resistor structure in the trench.

20 Claims, 15 Drawing Sheets

(51) Int. Cl.
  *H01L 21/8234* (2006.01)
  *H01L 29/66* (2006.01)
  *H01L 29/78* (2006.01)

(52) U.S. Cl.
  CPC ........ *H01L 28/24* (2013.01); *H01L 29/66545* (2013.01); *H01L 29/785* (2013.01)

(56) References Cited

U.S. PATENT DOCUMENTS

| | | |
|---|---|---|
| 7,119,415 B2 | 10/2006 | Norstrom et al. |
| 9,000,534 B2 | 4/2015 | Knorr et al. |
| 9,000,564 B2 | 4/2015 | Montanini et al. |
| 9,105,502 B2 | 8/2015 | Zhang et al. |
| 9,917,082 B1 * | 3/2018 | Basker ................ H01L 27/0629 |
| 2007/0040239 A1 | 2/2007 | Chinthakindi et al. |
| 2008/0132027 A1 | 6/2008 | Coolbaugh et al. |
| 2015/0311272 A1 | 10/2015 | Romanescu et al. |

OTHER PUBLICATIONS

Office Action with cited art in corresponding U.S. Appl. No. 15/723,680 dated Jun. 5, 2018.
Disclosed Anonymously, "Integrated circuits with FinFETs and resistors" IPCOM000241490D (May 5, 2015) pp. 1-3.
Disclosed Anonymously, "Method and Structure for Forming System-On-Chip Including Performance Device and Low-Power Device" IPCOM000198590D (Aug. 10, 2010) pp. 1-7.

* cited by examiner

APPROACH TO FABRICATION OF AN ON-CHIP RESISTOR WITH A FIELD EFFECT TRANSISTOR

BACKGROUND

Technical Field

The present invention generally relates to formation of a resistor on a substrate with fin field effect transistors (Fin-FETs), and more particularly to the fabrication of a 3-dimensional resistor adjacent to a FinFET using the same sequence of process steps.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS) device, where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

A method is provided for forming a resistor adjacent to a fin field effect transistor on a substrate. The method includes the step of forming a plurality of vertical fins on the substrate. The method further includes the steps of forming a dielectric fill layer on the plurality of vertical fins. The method further includes the step of forming at least two dummy gate structures on the plurality of vertical fins. The method further includes the step of forming a replaceable resistor structure on the dielectric fill layer over a region of the substrate unoccupied by vertical fins. The method further includes the step of forming a sidewall spacer on the at least two dummy gate structures and the replaceable resistor structure. The method further includes the step of removing the replaceable resistor structure to form a trench, and forming a resistor structure in the trench.

A method is provided for forming an arrangement of 3-dimensional resistors and fin field effect transistors on a region of a substrate. The method includes the step of forming a plurality of vertical fins on the substrate. The method further includes the step of forming a dielectric fill layer on the plurality of vertical fins. The method further includes the step of forming at least two dummy gate structures across the plurality of vertical fins. The method further includes the step of forming at least one replaceable resistor structure on the dielectric fill layer, where the at least one replaceable resistor structure is adjacent to the end faces of the plurality of vertical fins. The method further includes the steps of forming a sidewall spacer on each of the at least two dummy gate structures and the at least one replaceable resistor structure. The method further includes the steps of forming an interlayer dielectric (ILD) layer on the sidewall spacer on each of the at least two dummy gate structures and the at least one replaceable resistor structure, where the ILD layer fills in spaces between the sidewall spacers. The method further includes the steps of removing the at least one replaceable resistor structure to form a resistor trench and expose the sidewall spacer. The method further includes the steps of forming a pinch-off layer on the exposed sidewall spacer, forming a resistor layer on the pinch-off layer, and forming an insulating fill layer on the resistor layer.

A resistor on a substrate is provided. The resistor on a substrate includes a sidewall spacer on a substrate. The resistor on a substrate further includes a pinch-off layer on the sidewall spacer, a resistor layer on the pinch-off layer, and an insulating fill layer on the resistor layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
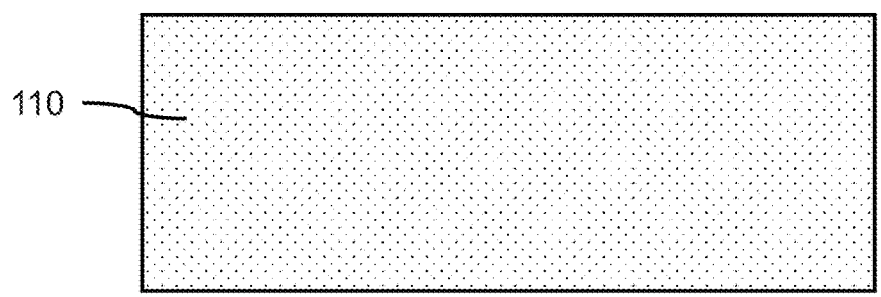
FIG. 1 is a cross-sectional side view showing a substrate, in accordance with an embodiment of the present invention.

Principles and embodiments of the present disclosure relate generally to formation of a combination of a fin field effect transistor (FinFET) and a resistor formed in the same neighborhood on a substrate. In one or more embodiments, an on-chip resister may be formed adjacent to a vertical fin forming a channel for a field effect transistor (FET), or one or more on-chip resistor(s) may be formed on the same region of a substrate adjacent to a region on which one or more FinFETs are formed, such that the resistor(s) are in the same neighborhood as the FinFETs.

Principles and embodiments of the present disclosure also relate generally to forming one or more on-chip resistor(s) and one or more FinFET(s) with the same sequence of deposition and etching processes, without adding extra process steps and masks to the fabrication flow. In particular, no dedicated resistor mask may be needed for the fabrication. An on-chip resistor can be formed on the substrate with geometries and materials that are also used in the fabrication of a FinFET on the same substrate.

Principles and embodiments of the present disclosure also relate generally to on-chip resistors having a 3-dimensional (3D) configuration to conform to shapes of the FinFET components, for example, an active or dummy gate structure, that requires less area, so as to save space on the substrate. The present principles and embodiments may involve controlling the configuration and dimensions of a 3-dimensional on-chip resistor through gate mask tolerances and conformal deposition of material layers to control layer thicknesses. A 3-dimensional on-chip resistor can be aligned with other fabricated FinFET components using the same mask, for example, a gate mask that has much better placement/control/tolerancing than a conventional resistor mask. By utilizing controlled lateral thicknesses, a resistor with tightly controlled dimensions can be formed.

Exemplary applications/uses to which the present principles can be applied include, but are not limited to: formation of system-on-chip (SoC) devices and applications, where fabrication of on-chip resistors eliminates additional steps for coupling resistors to FinFETs.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions may be epitaxial processes, and the deposited material may be crystalline. In various embodiments, formation of a layer may be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a substrate is shown, in accordance with the present principles.

In one or more embodiments, a substrate 110 may be a semiconductor or an insulator with an active surface semiconductor layer. The substrate may be crystalline, semicrystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In various embodiments, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

Figure 2:
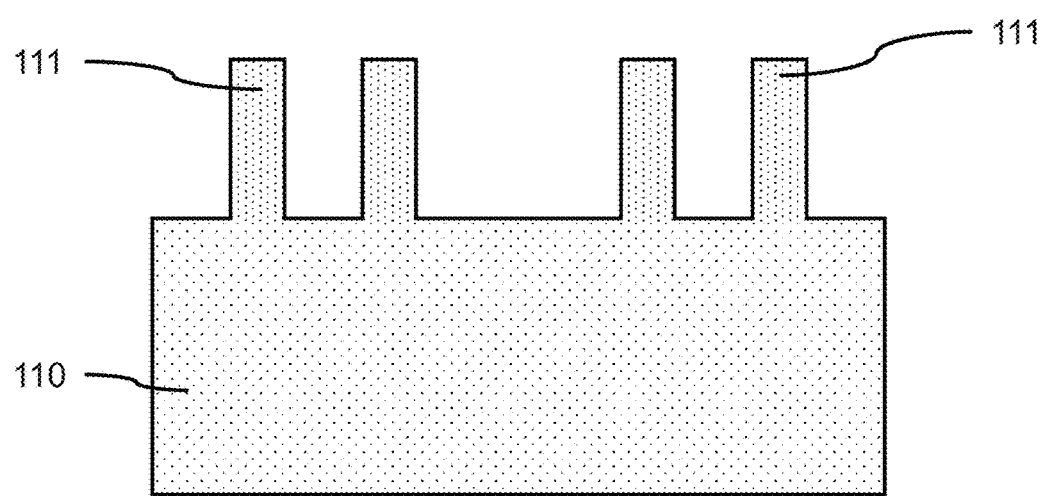
FIG. 2 is a cross-sectional side view showing a plurality of vertical fins formed on the substrate, in accordance with an embodiment of the present invention.

FIG. 2 is a cross-sectional side view of a plurality of vertical fins formed on the substrate, in accordance with the present principles.

In various embodiments, a plurality of vertical fins may be formed by a sidewall image transfer (SIT) process, self-aligned double patterning (SADP), or self-aligned quadruple patterning (SAQP) to provide a tight pitch between vertical fins. In various embodiments, a direct contact lithographic process may be employed for looser fin pitches.

In one or more embodiments, a plurality of vertical fins 111 may be formed on at least a region of a substrate 110, where the plurality of vertical fins may formed from the crystalline material of the substrate or a crystalline layer formed on the surface of the substrate. The plurality of vertical fins 111 may have a fin pattern on the substrate 110. The vertical fins can be the same material as the substrate 110, or a different material than the substrate, for example, the substrate can be single crystal silicon and the vertical fin(s) 111 can be single crystal silicon-germanium epitaxially grown on the substrate. The vertical fins 111 may be stressed.

In one or more embodiments, a vertical fin 111 can be formed on a substrate 110, where the vertical fin can be formed by a sidewall image transfer (SIT) process, as would be known in the art. In various embodiments, the vertical fins 111 may be etched into the substrate 110 or an epitaxial layer on the substrate by employing a lithographic patterning process, a SIT process, (e.g., self-aligned quadruple patterning (SAQP) or a self-aligned double patterning (SADP)), or epitaxially grown on the substrate. In one or more embodiments, fins are formed by a SIT process.

In one or more embodiments, the one or more vertical fin(s) 111 may have a width in the range of about 3 nm to about 15 nm, or in the range of about 4 nm to about 10 nm.

In one or more embodiments, the one or more vertical fin(s) 111 may have a length in the range of about 5 nm to about 500 nm, or in the range of about 50 nm to about 200 nm, although other lengths are contemplated.

In one or more embodiments, the one or more vertical fin(s) 111 may have a height in the range of about 5 nm to about 60 nm, or in the range of about 20 nm to about 40 nm.

Figure 3:
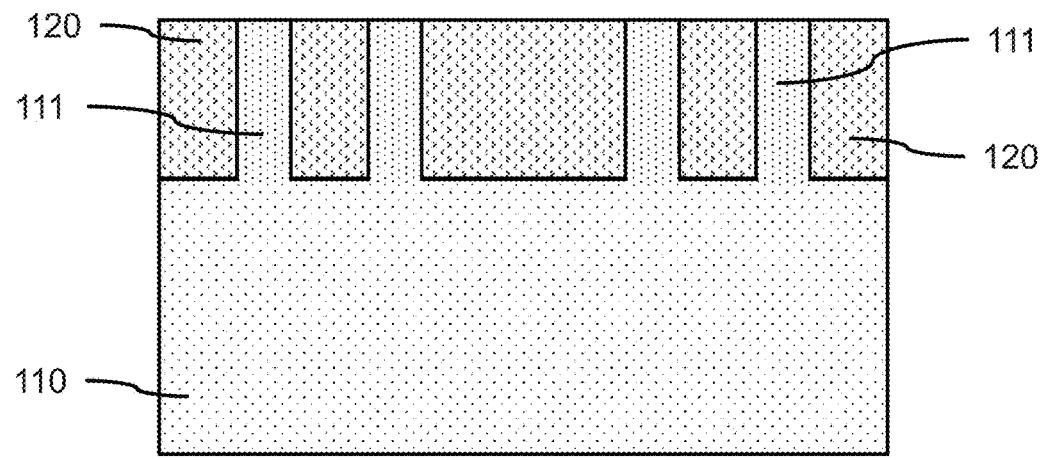
FIG. 3 is a cross-sectional side view showing a dielectric fill layer in the space(s) between the vertical fins, in accordance with an embodiment of the present invention.

FIG. 3 is a cross-sectional side view showing a dielectric fill layer in the space(s) between the vertical fins, in accordance with an embodiment of the present invention.

In one or more embodiments, a dielectric fill layer 120 may be formed on the one or more vertical fin(s) 111 and intervening substrate surface, where the dielectric fill layer 120 may be formed by a blanket deposition on at least a portion of the substrate 110, where the blanket deposition can fill the space(s) between and around the vertical fins 111. The dielectric fill layer 120 may be formed by CVD, PVD, or spun on. The blanket deposited dielectric fill layer 120 may extend above the top surfaces of the one or more vertical fin(s) 111, and a chemical mechanical polishing (CMP) can be used to remove excess material and reduce the height of the dielectric fill layer 120 to the top surfaces of the one or more vertical fin(s) 111. The CMP may reduce the height of the dielectric fill layer 120 and remove a portion of the one or more vertical fin(s) 111, where the CMP provides a smooth, flat surface.

In one or more embodiments, the dielectric fill layer 120 may be silicon dioxide ($SiO_2$) or a low-k dielectric material. In various embodiments, the $SiO_2$ can be a high aspect retio plasma (HARP) oxide, a high density plasma (HDP) CVD oxide, or a flower-shaped dielectric oxide (e.g., flower-shaped indium oxide, flower-shaped zinc oxide). The low-k dielectric material may be a fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogensilsesquioxane (HSQ) and methylsilsesquioxane (MSQ)), or combinations thereof.

Figure 4:
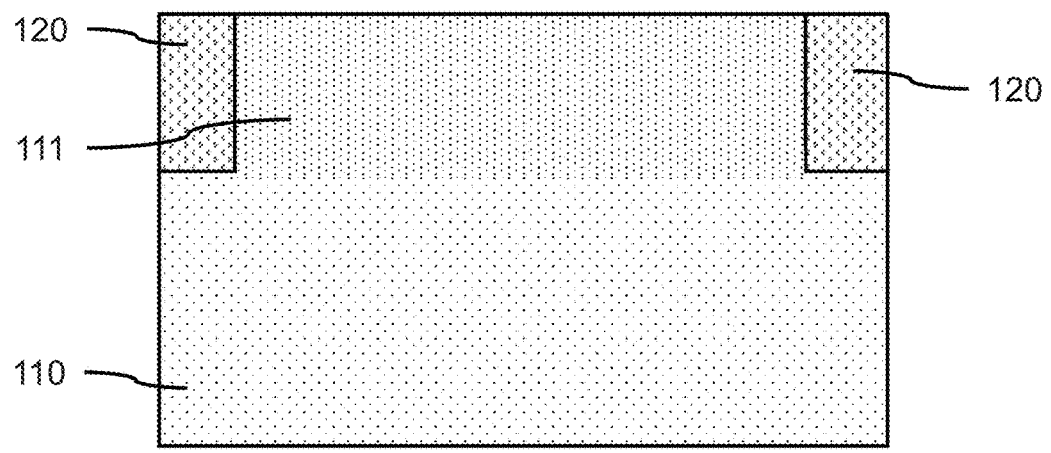
FIG. 4 is a cross-sectional side view along a long axis of a fin showing a dielectric fill layer on the end faces of a vertical fins, in accordance with an embodiment of the present invention.

FIG. 4 is a cross-sectional side view along a long axis of a fin showing a dielectric fill layer on the end faces of a vertical fins, in accordance with an embodiment of the present invention.

In one or more embodiments, the dielectric fill layer 120 may surround the one or more vertical fin(s) 111, where the dielectric fill layer 120 can be in contact with the sidewalls and end faces of the vertical fin(s) 111. The dielectric fill layer 120 can provide mechanical support to the vertical fin(s) 111 during subsequent fabrication processes.

Figure 5:
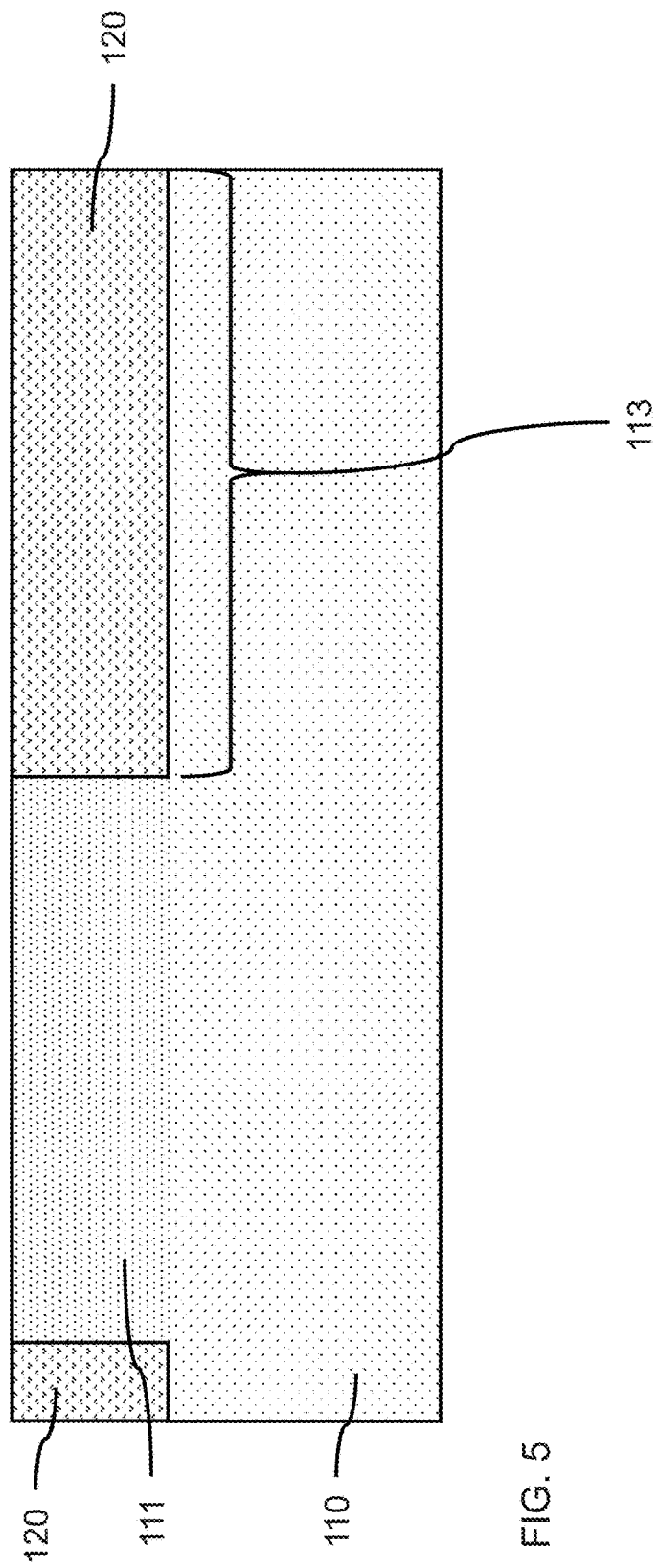
FIG. 5 is a cross-sectional side view along a long axis of a fin showing a vertical fin with a dielectric fill layer on an otherwise unoccupied region of the substrate adjacent to the vertical fin, in accordance with an embodiment of the present invention.

FIG. 5 is a cross-sectional side view along a long axis of a fin showing a vertical fin with a dielectric fill layer on an otherwise unoccupied region of the substrate adjacent to the vertical fin, in accordance with an embodiment of the present invention.

In one or more embodiments, vertical fin(s) 111 may not be formed on an unoccupied region 113 of the substrate 110 to provide for the subsequent formation of an on-chip resistor. A replaceable resistor structure, for example, a dummy gate structure, can be formed on the dielectric fill layer 120 above the region of the substrate to reserve the unoccupied space and provide a template for formation of the on-chip resistor.

Figure 6:
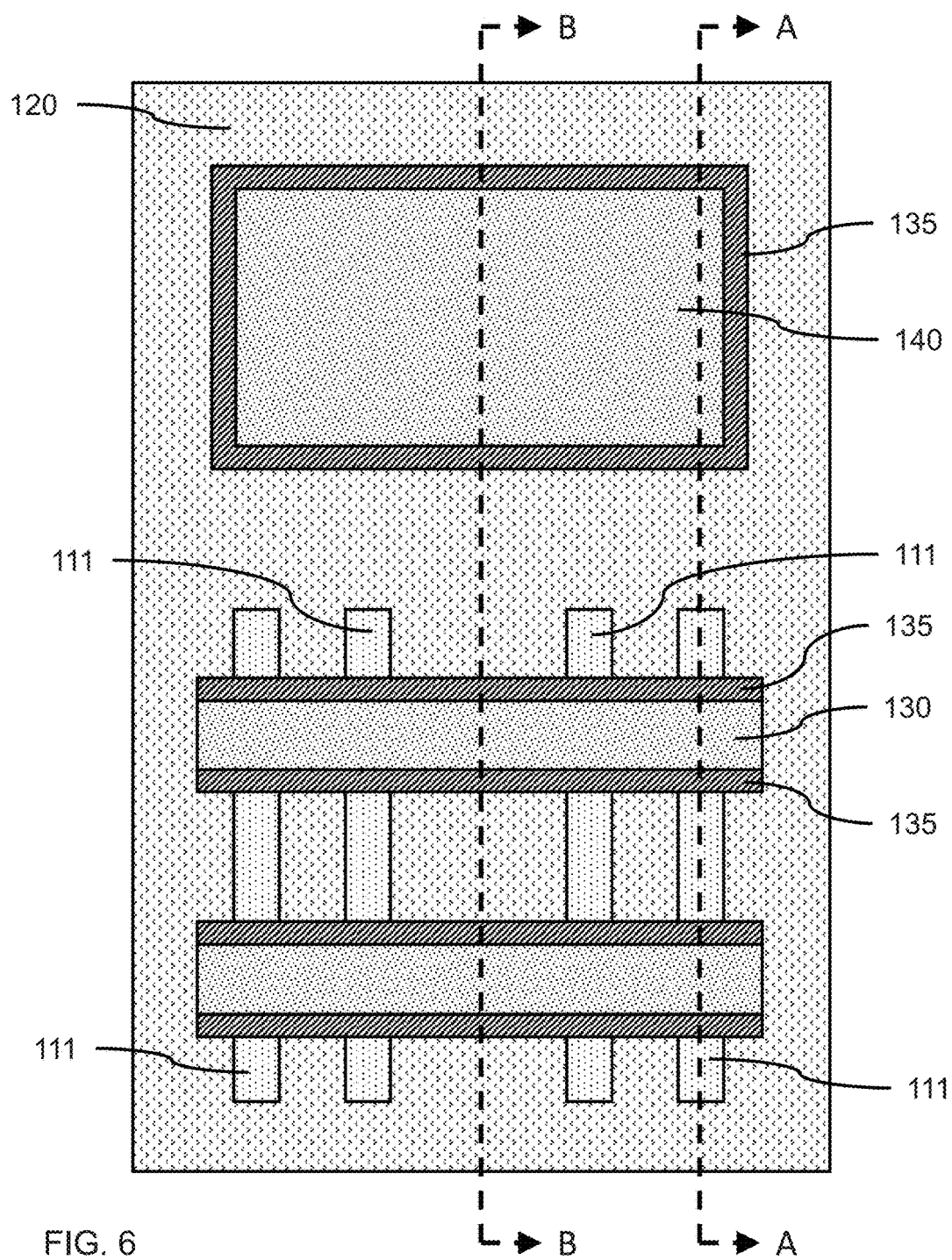
FIG. 6 is a top view showing a plurality of vertical fins, a dielectric fill layer between the vertical fins, a pair of dummy gate structures on the vertical fins, and a replaceable resistor structure on the substrate adjacent to the plurality of vertical fins, in accordance with an embodiment of the present invention.

FIG. 6 is a top view showing a plurality of vertical fins, a dielectric fill layer between the vertical fins, a pair of dummy gate structures on the vertical fins, and a replaceable resistor structure on the substrate adjacent to the plurality of vertical fins, in accordance with an embodiment of the present invention.

In one or more embodiments, one or more dummy gate structures(s) 130 and one or more replaceable resistor structure(s) 140 may be formed on a substrate 110, where the one or more dummy gate structures(s) 130 may be formed on one or more vertical fin(s) 111. The one or more dummy gate structures(s) 130 and one or more replaceable resistor structure(s) 140 may have a sidewall spacer 135, where a sidewall spacer 135 may wrap around the replaceable resistor structure(s) 140. The one or more dummy gate structures(s) 130 and one or more replaceable resistor structure(s) 140 can be formed at the same time, where the dummy gate(s) 130 and replaceable resistor structure(s) 140 may be made of the same material deposited at the same time.

In various embodiments, the dummy gate structures(s) 130 and replaceable resistor structure(s) 140 can be amorphous silicon (a-Si), poly-silicon (p-Si), amorphous carbon (a-C), silicon-germanium (SiGe), or suitable combinations thereof, where the replaceable resistor structure(s) 140 and dummy gate structure(s) 130 can be selectively etched relative to the sidewall spacer(s) 135.

Figure 7:
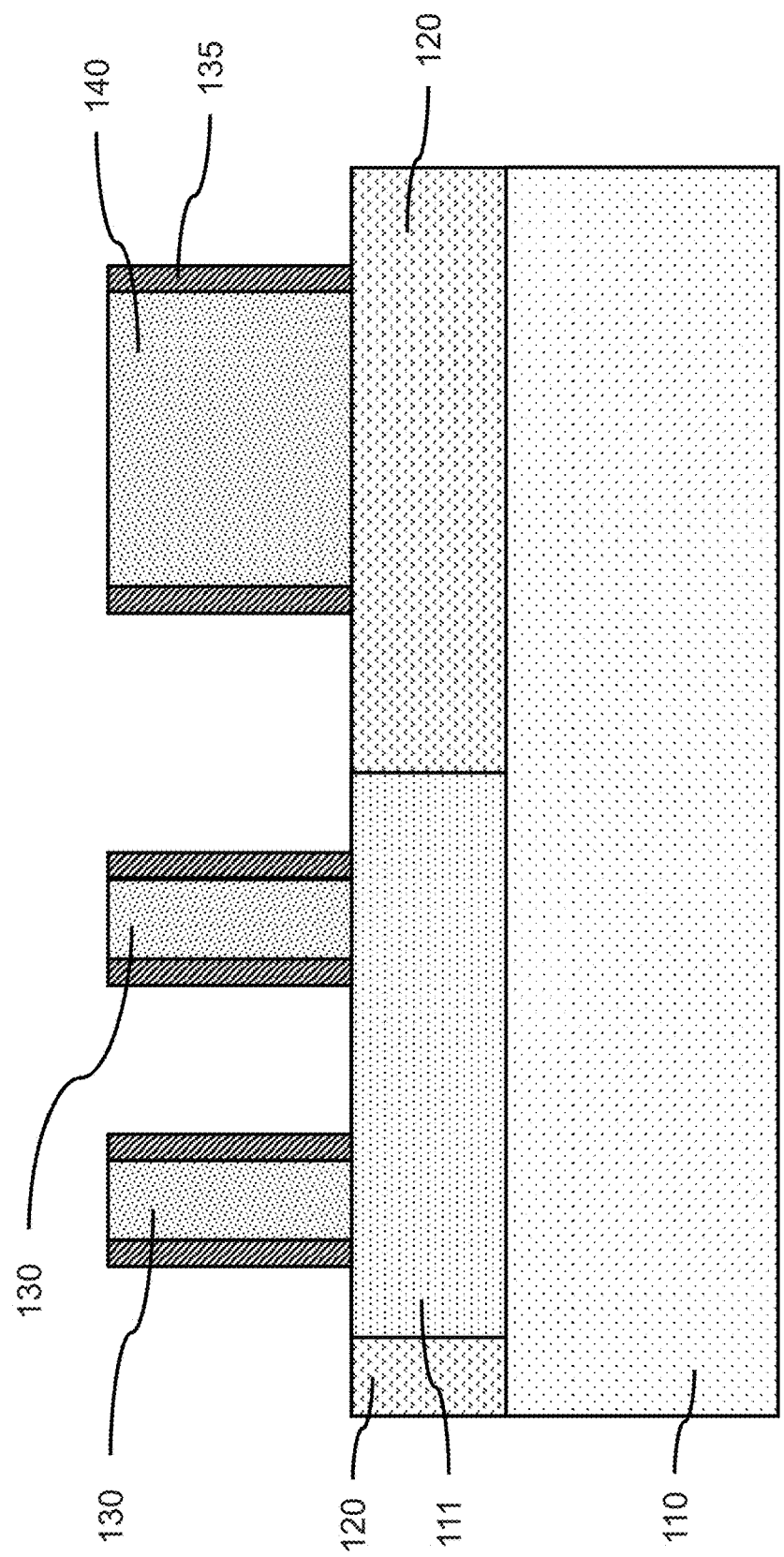
FIG. 7 is a cross-sectional side view showing the AA cross-section of FIG. 6 with a replaceable resistor structure on a portion of the dielectric fill layer and dummy gate structures on the vertical fin, in accordance with an embodiment of the present invention.

FIG. 7 is a cross-sectional side view showing the AA cross-section of FIG. 6 with a replaceable resistor structure on a portion of the dielectric fill layer and dummy gate structures on the vertical fin, in accordance with an embodiment of the present invention.

In one or more embodiments, a replaceable resistor structure 140 and dummy gate structures 130 can be formed on the vertical fin(s) 111 and dielectric fill layer 120 by forming a temporary resist layer (e.g., a polymeric resist material) on the vertical fin(s) 111 and dielectric fill layer 120, for example, by a blanket deposition, and patterning the temporary resist layer to form opening(s), as would be known in the art. The replaceable resistor structure 140 and dummy gate structures 130 can be formed in the openings, after which the temporary resist layer can be removed (e.g., by stripping, ashing, etc.).

In one or more embodiments, a sidewall spacer layer can be formed on the exposed surfaces of the replaceable resistor structure 140 and dummy gate structures 130, for example, by a blanket (e.g., CVD, PECVD) or conformal deposition (e.g., ALD, PEALD) to provide a layer of a predetermined thickness. The sidewall spacer layer can be etched back to leave the sidewall spacer 135 on the sidewalls of the replaceable resistor structure 140 and dummy gate structures 130, for example, by a reactive ion etch (RIE). Each sidewall spacer 135 may surround the replaceable resistor structures 140 and dummy gate structures 130 on four sides, such that the replaceable resistor structure 140 and dummy gate structures 130 is within a sidewall spacer 135.

In various embodiments, the walls of the sidewall spacer(s) 135 can have a thickness in the range of about 3 nm to about 15 nm, or in the range of about 4 nm to about 8 nm, although greater or less thickness can also be used.

In various embodiments, the sidewall spacers 135 can be made of materials, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), or combinations thereof. In one or more embodiments, the sidewall spacer(s) 135 are a different material from the dielectric fill layer 120.

Figure 8:
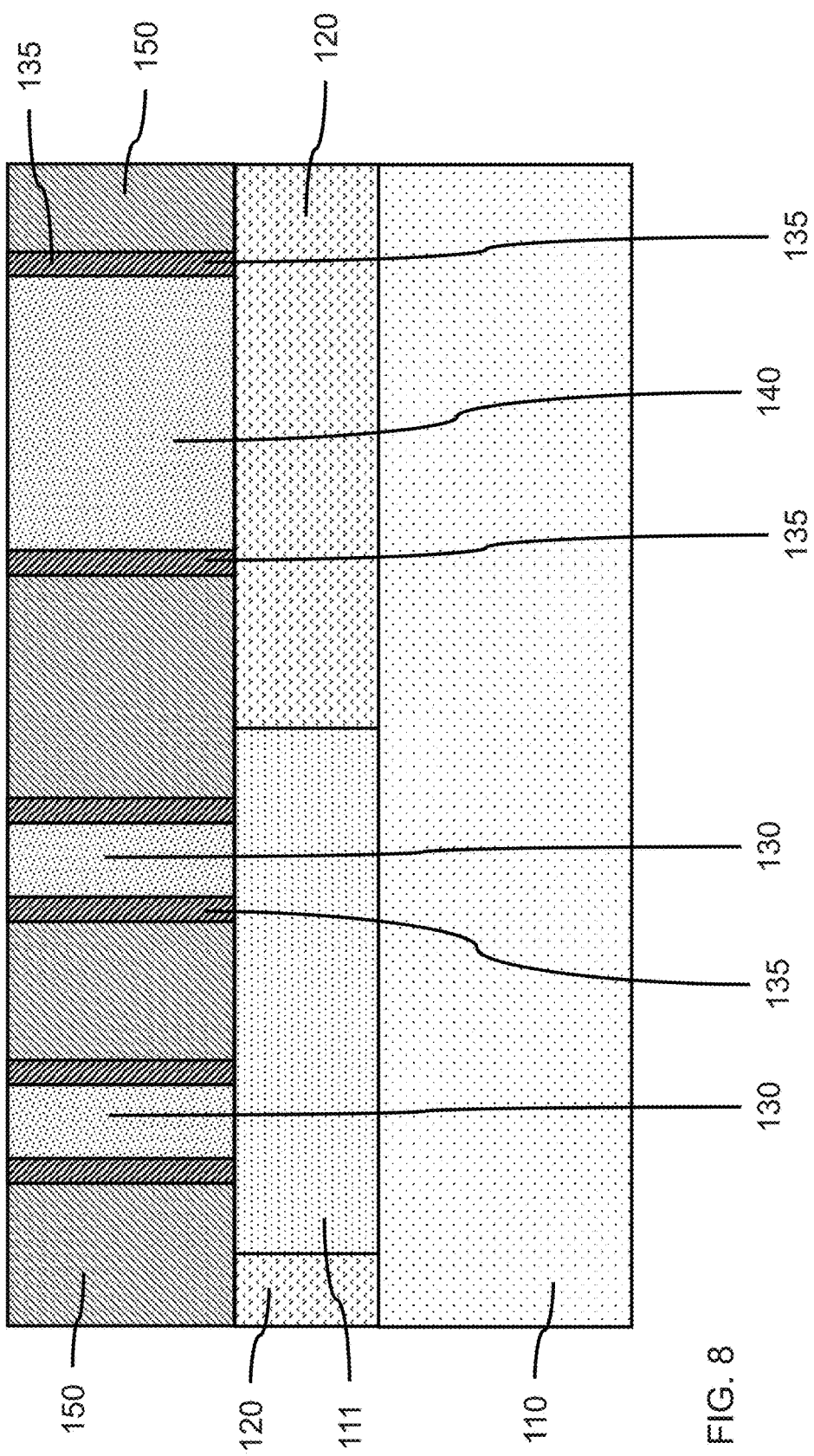
FIG. 8 is a cross-sectional side view showing the AA cross-section of FIG. 6 with an interlayer dielectric (ILD) layer on the replaceable resistor structure, dummy gate structures, and vertical fin, in accordance with an embodiment of the present invention.

FIG. 8 is a cross-sectional side view showing the AA cross-section of FIG. 6 with an interlayer dielectric (ILD) layer on the replaceable resistor structure, dummy gate structures, and vertical fin, in accordance with an embodiment of the present invention.

In one or more embodiments, an interlayer dielectric (ILD) layer 150 can be formed on the replaceable resistor structures 140, dummy gate structures 130, sidewall spacer(s) 135, and vertical fins 111. The ILD layer 150 can be blanket deposited to cover the exposed portions of the dielectric fill layer 120 and fill in the spaces between the vertical fins 111. A portion of the ILD layer 150 on the top surfaces of the replaceable resistor structures 140, dummy gate structures 130 can be removed, for example, by a chemical-mechanical polishing (CMP) to form a smooth, flat surface for subsequent processing.

In one or more embodiments, the ILD layer 150 can be silicon oxide (SiO), a low-K insulating dielectric, silicon oxynitride (SiON), carbon doped silicon oxide, fluorine doped silicon oxide, boron carbon nitride, hydrogen silsesquioxane polymer (HSQ), methyl silsesquioxane polymer (MSQ), methyl doped silica or $SiO_x(CH_3)y$ or $SiC_xO_yH_z$, organosilicate glass (SiCOH), porous SiCOH, and/or combinations thereof.

Figure 9:
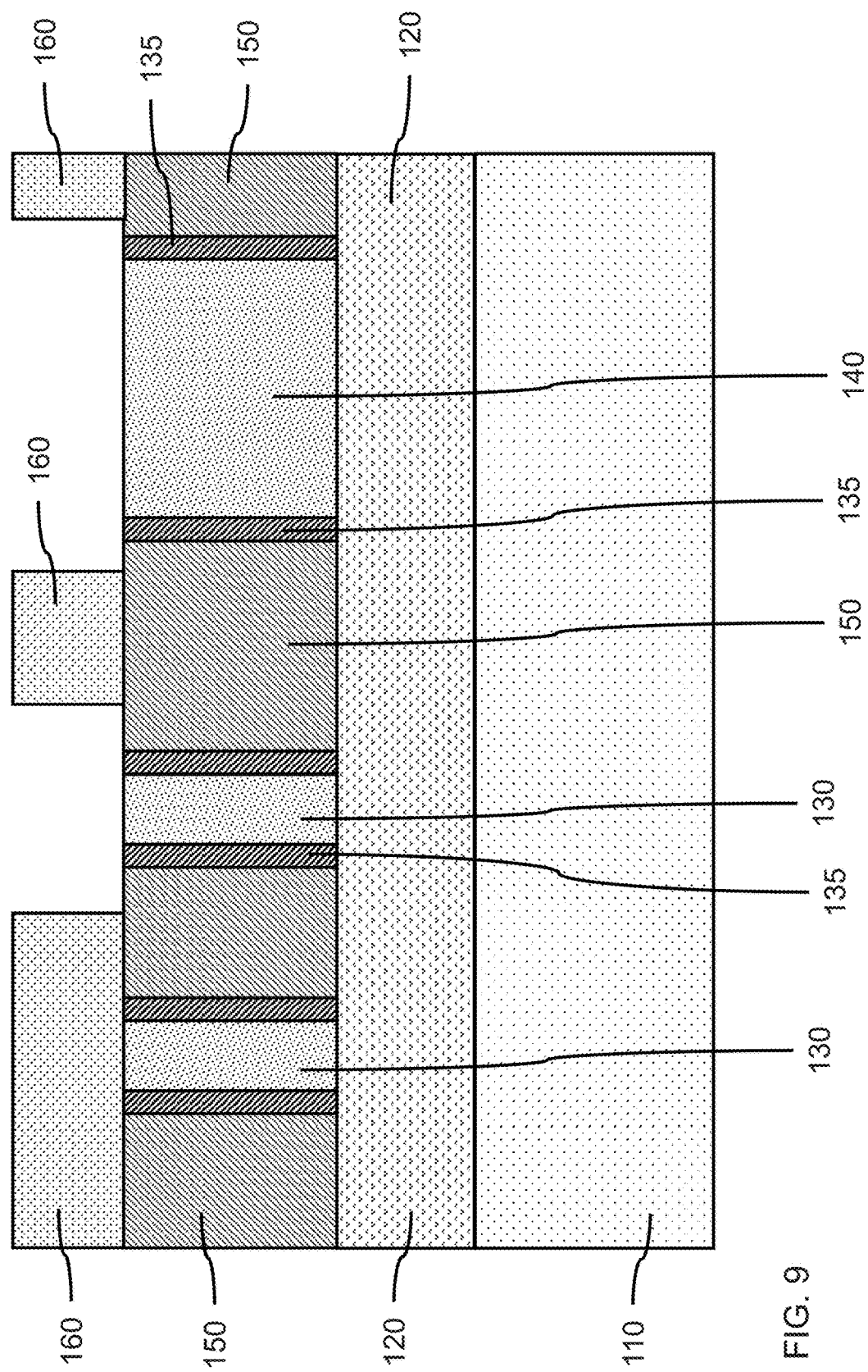
FIG. 9 is a cross-sectional side view showing the BB cross-section of FIG. 6 with a masking layer on the interlayer dielectric (ILD) layer, and openings formed above the replaceable resistor structure and a portion of a dummy gate structure, in accordance with an embodiment of the present invention.

FIG. 9 is a cross-sectional side view showing the BB cross-section of FIG. 6 with a masking layer on the interlayer dielectric (ILD) layer, and openings formed above the replaceable resistor structure and a portion of a dummy gate structure, in accordance with an embodiment of the present invention.

In one or more embodiments, a masking layer 160 can be formed on the ILD layer 150, replaceable resistor structures 140, dummy gate structures 130, and sidewall spacer(s) 135. The masking layer 160 (e.g., organic resist, hard mask, soft mask, etc.) can be patterned and developed to form one or more openings that expose underlying replaceable resistor structures 140 and/or dummy gate structures 130, as would be known in the art.

Figure 10:
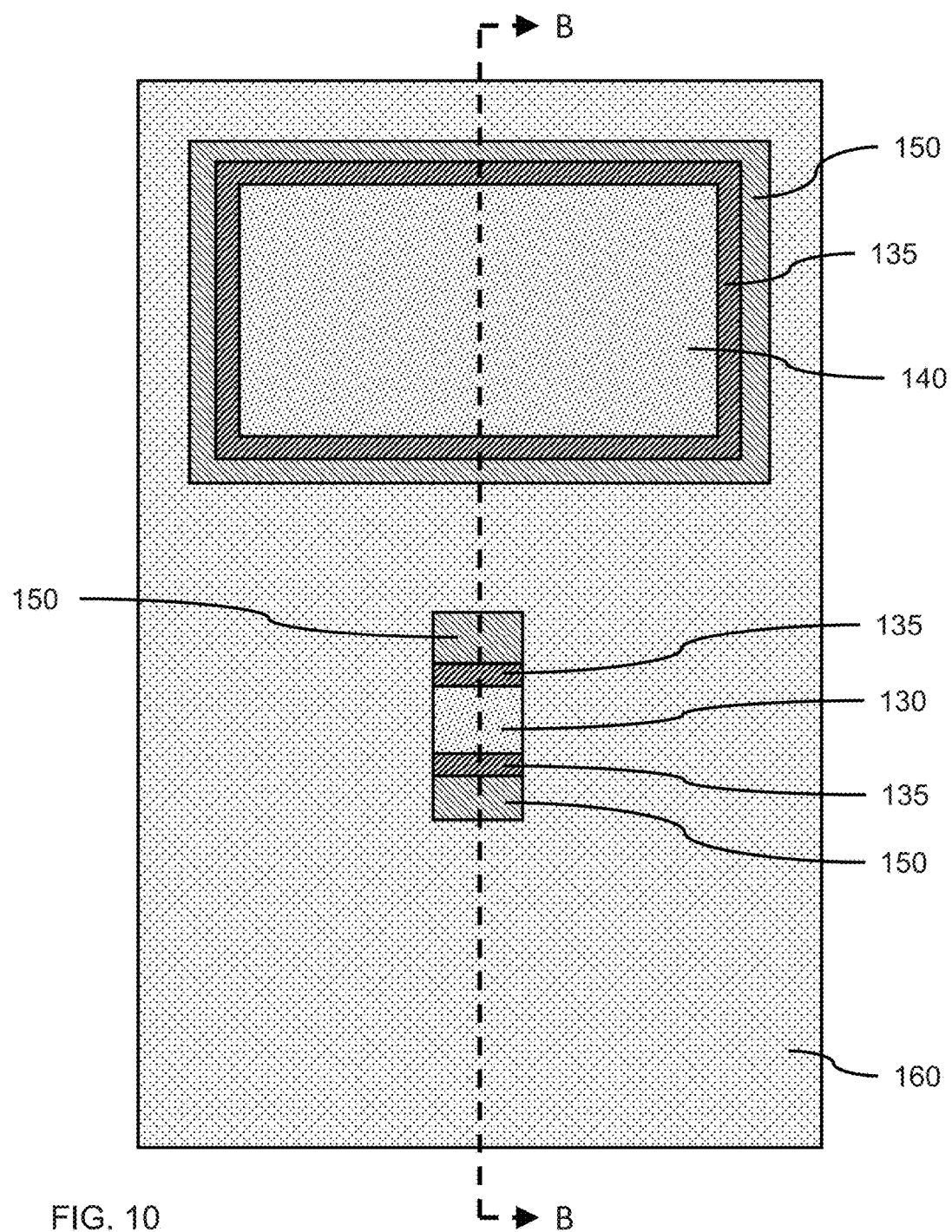
FIG. 10 is a top view showing the openings formed in the masking layer exposing the replaceable resistor structure and a portion of a dummy gate structure, in accordance with an embodiment of the present invention.

FIG. 10 is a top view showing the openings formed in the masking layer exposing the replaceable resistor structure and a portion of a dummy gate structure, in accordance with an embodiment of the present invention.

In one or more embodiments, the openings can be patterned and formed in the masking layer 160 to expose one or more of the replaceable resistor structures 140 intended to be removed.

In one or more embodiments, a portion of the masking layer 160 can be removed to expose underlying portions of the vertical fin(s) 111 and/or dummy gate structure(s) 130, where the portion of the exposed dummy gate structure(s) 130 can be between two vertical fins 111. The removal of the portion of the masking layer 160 can also expose portions of the sidewall spacer(s) 135 and ILD layer 150 surrounding the sidewall spacer(s) 135, replaceable resistor structures 140 and/or dummy gate structures 130.

Figure 11:
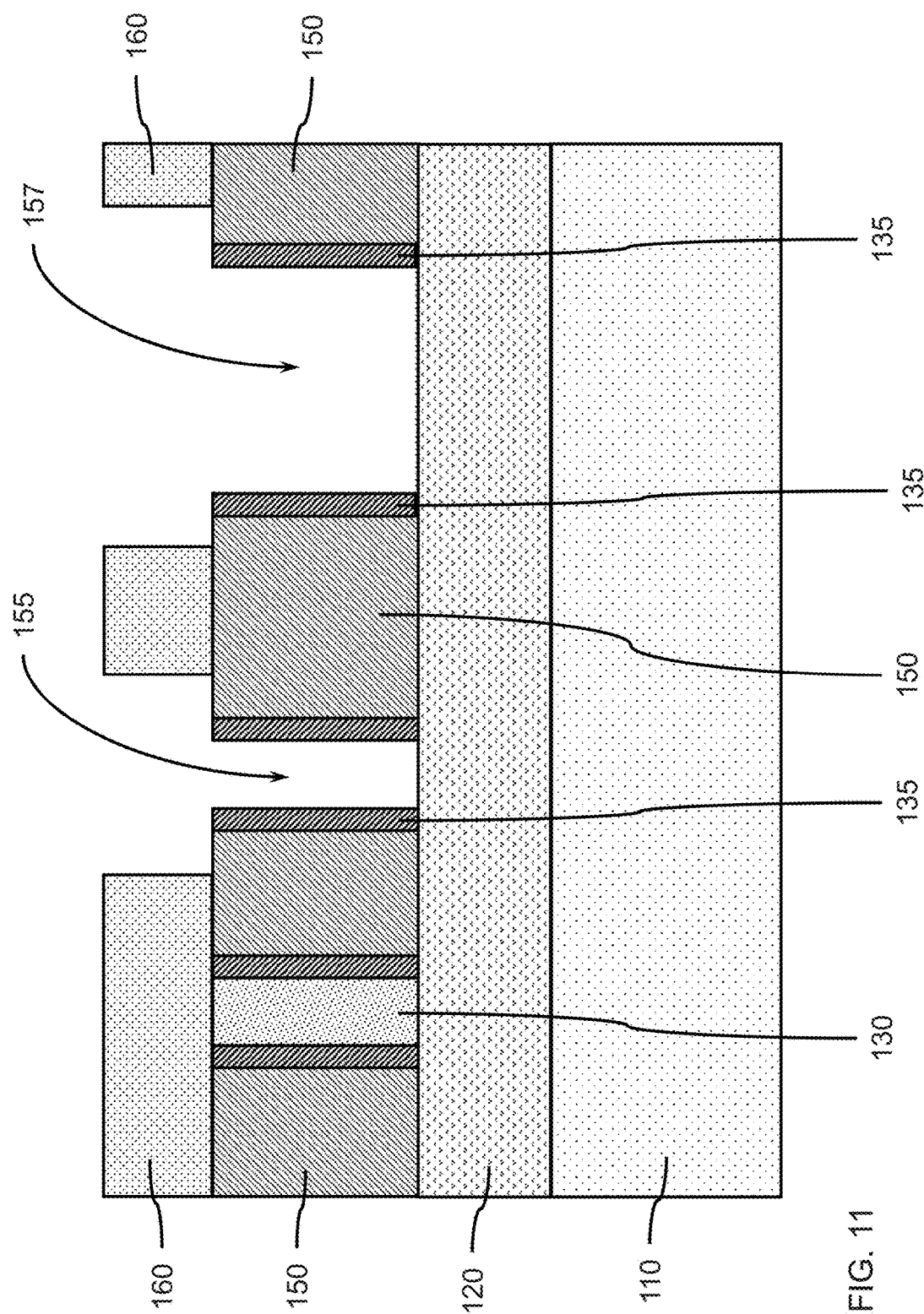
FIG. 11 is a cross-sectional side view of the BB cross-section of FIG. 10 after removal of the replaceable resistor structure and portion of a dummy gate structure, in accordance with an embodiment of the present invention.

FIG. 11 is a cross-sectional side view of the BB cross-section of FIG. 10 after removal of the replaceable resistor structure and portion of a dummy gate structure, in accordance with an embodiment of the present invention.

In one or more embodiments, the exposed replaceable resistor structures 140 and/or dummy gate structures 130 can be removed, for example, by a selective etch (e.g., selective RIE or wet etch) to form a dummy gate trench 155 and/or a resistor trench 157. The removal of the replaceable resistor structures 140 and/or dummy gate structures 130 can expose the underlying dielectric fill layer 120. The sidewall spacers 135 can remain after removal of the replaceable resistor structures 140 and/or dummy gate structures 130 to provide a dielectric barrier around a resistor, and/or on a gate structure.

Figure 12:
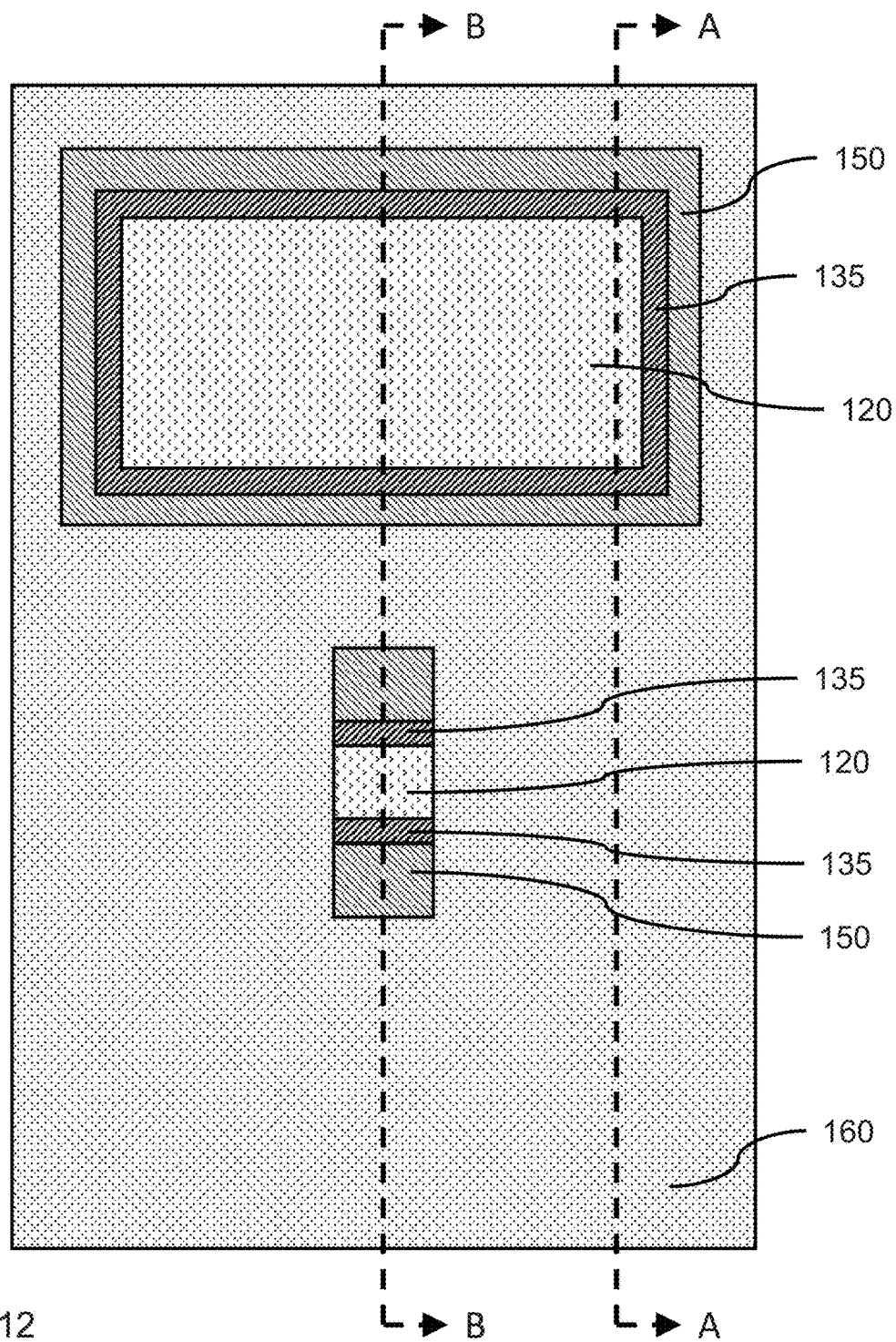
FIG. 12 is a top view showing the exposed dielectric fill layer after removal of the replaceable resistor structure and portion of one of the dummy gate structures, in accordance with an embodiment of the present invention.

FIG. 12 is a top view showing the exposed dielectric fill layer after removal of the replaceable resistor structure and portion of one of the dummy gate structures, in accordance with an embodiment of the present invention.

In one or more embodiments, in one or more embodiments, removal of a portion of a dummy gate structure 130 can separate the dummy gate structure into two segments, where each segment may be replaced with an individual functional gate structure on different vertical fins 111.

Figure 13:
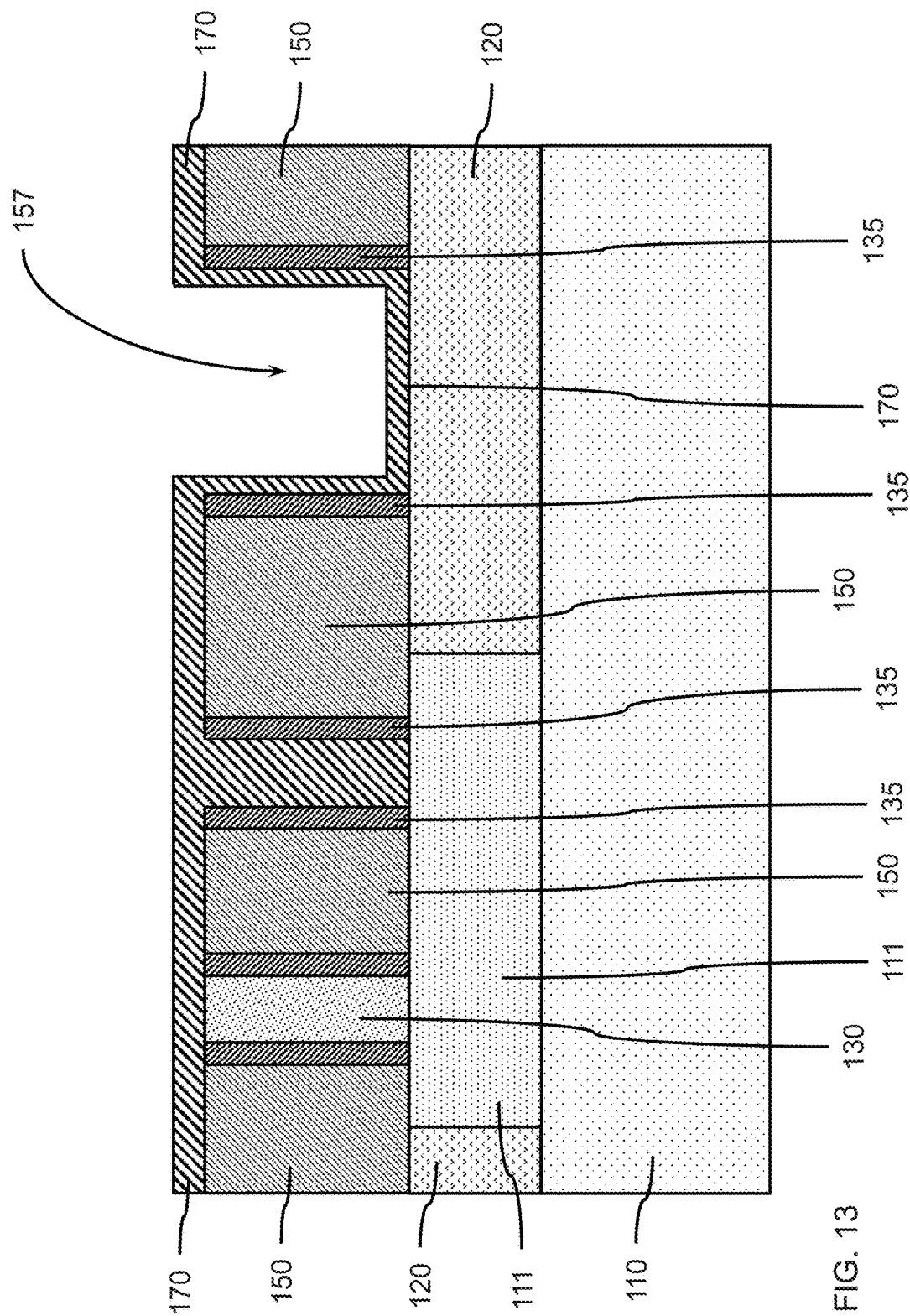
FIG. 13 is a cross-sectional side view showing the AA cross-section of FIG. 12 showing a pinch-off layer in the openings formed by removal of the replaceable resistor structure and portion of one of the dummy gate structures, in accordance with an embodiment of the present invention.

FIG. 13 is a cross-sectional side view showing the AA cross-section of FIG. 12 showing a pinch-off layer in the openings formed by removal of the replaceable resistor structure and portion of one of the dummy gate structures, in accordance with an embodiment of the present invention.

In one or more embodiments, the masking layer 160 can be removed from the the ILD layer 150, replaceable resistor structures 140, dummy gate structures 130, sidewall spacer(s) 135, where the masking layer can be removed prior to forming subsequent layers in the dummy gate trench 155 and/or resistor trench 157.

In one or more embodiments, a pinch-off layer 170 can be formed on the exposed surfaces of the sidewall spacers 135, dielectric fill layer 120, dummy gate structures 130, and ILD layer 150, where the pinch-off layer can be blanket deposited on the exposed surfaces, for example by CVD, PECVD, PVD, etc.

In one or more embodiments, the pinch-off layer 170 can have a thickness in the range of about 5 nm to about 20 nm, or in the range of about 8 nm to about 15 nm, although other thicknesses are also contemplated.

In various embodiments, the pinch-off layer 170 can be silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

Figure 14:
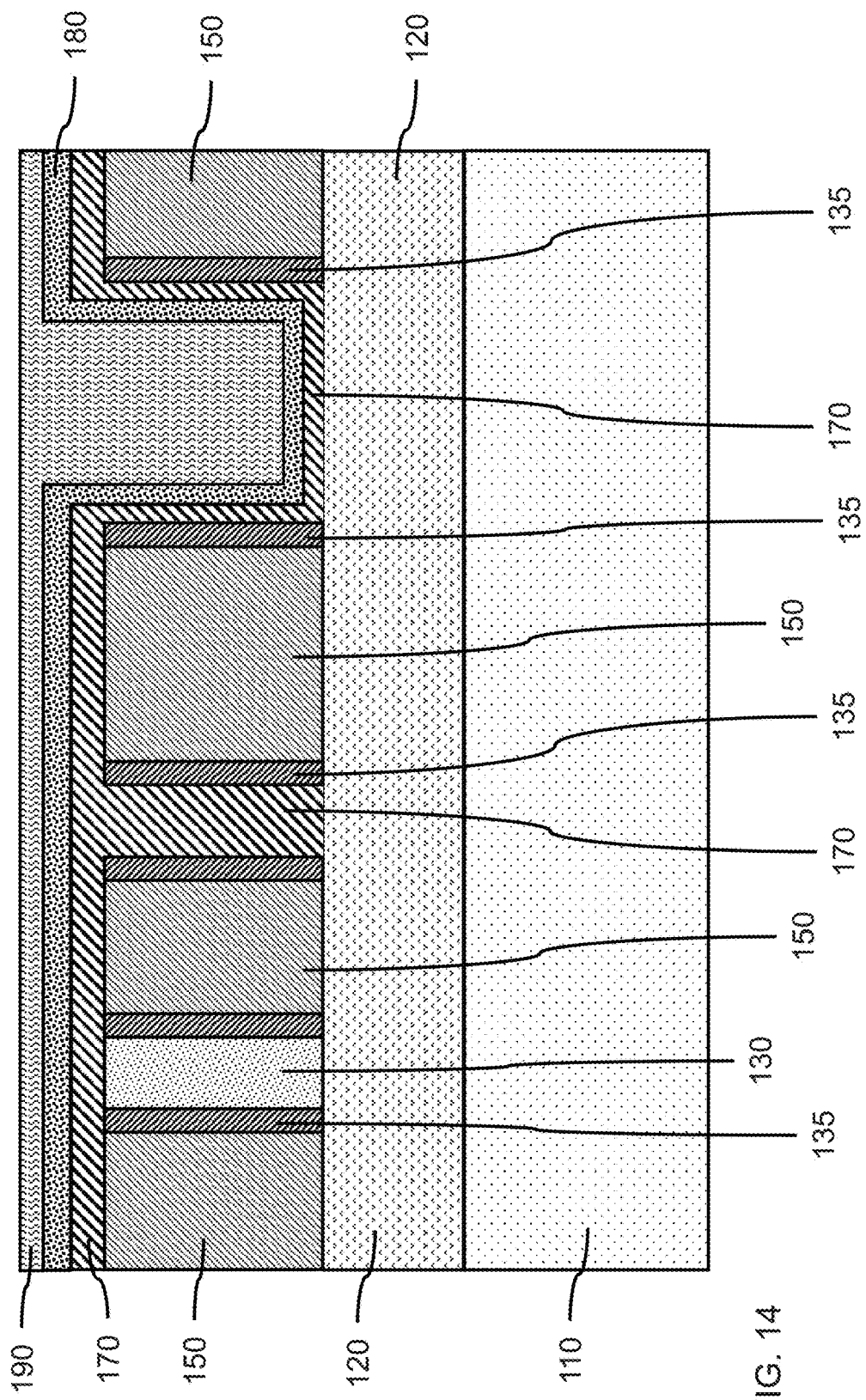
FIG. 14 is a cross-sectional side view showing the BB cross-section of FIG. 12 after forming a resistor layer on the pinch-off layer and an insulating fill layer on the resistor layer, in accordance with an embodiment of the present invention.

FIG. 14 is a cross-sectional side view showing the BB cross-section of FIG. 12 after forming a resistor layer on the pinch-off layer and an insulating fill layer on the resistor layer, in accordance with an embodiment of the present invention.

In one or more embodiments, the pinch-off layer can fill the dummy gate trench(es) 155 to electrically separate two or more segments of a functional gate structure, where the thickness of the pinch-off layer can be based on the width of the dummy gate trench(es) 155 to be filled.

In one or more embodiments, a resistor layer 180 can be formed on the pinch-off layer 170, for example by a blanket deposition.

In various embodiments the resistor layer 180 can have a thickness in the range of about 5 nm to about 30 nm, or in the range of about 10 nm to about 20 nm, where the thickness can be based on achieving a predetermined resistance for the resistor.

In one or more embodiments, the resistor layer 180 can be tungsten silicide (WSi), tungsten (W), titanium nitride (TiN), or combinations thereof, where the resistor material can be based on having a predetermined resistivity and/or achieving a predetermined resistance for the resistor.

In one or more embodiments, an insulating fill layer 190 can be formed on the resistor layer 180, where the insulating fill layer 190 can fill in the remaining space in the resistor trench after formation of the resistor layer 180 and pinch-off layer 170.

In one or more embodiments, the insulating fill layer 190 can be silicon nitride (SiN), silicon oxynitride (SiON) or silicon oxycarbide (SiOC).

Figure 15:
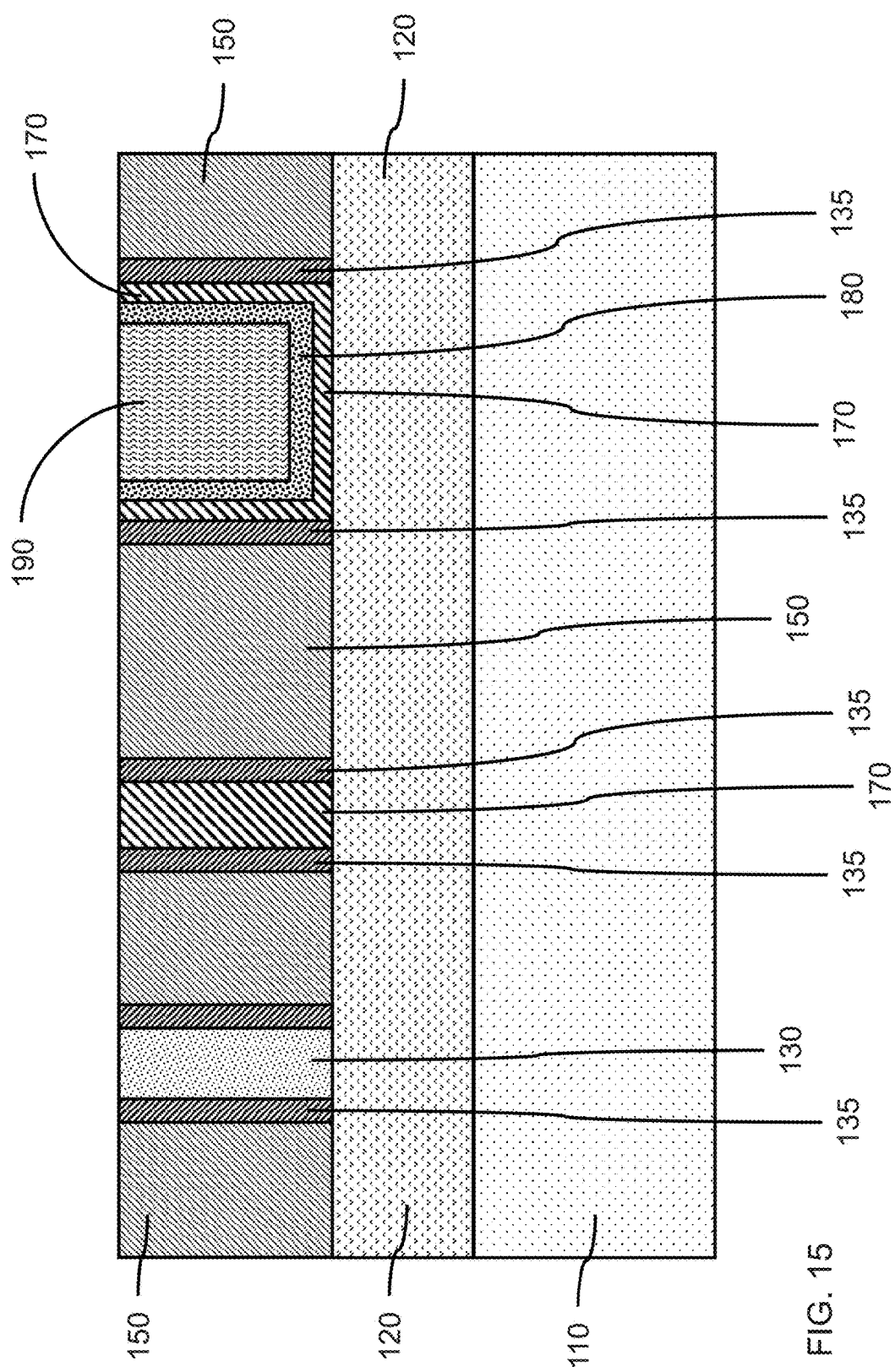
FIG. 15 is a cross-sectional side view showing a 3-dimensional resistor formed in the resistor trench, and a gate spacer in the gate opening, in accordance with an embodiment of the present invention.

FIG. 15 is a cross-sectional side view showing a 3-dimensional resistor formed in the resistor trench, and a gate spacer in the gate opening, in accordance with an embodiment of the present invention.

In one or more embodiments, the portions of the insulating fill layer 190, resistor layer 180 and pinch-off layer 170 above the surface of the sidewall spacers 135 and ILD layer 150, where the materials can be removed by CMP to provide a smooth, flat surface. The CMP can stop at the ILD layer surface.

In one or more embodiments, the insulating fill layer 190, resistor layer 180 and pinch-off layer 170 remaining in the resistor trench 157 after the CMP can form a 3-dimensional resistor, where at least a portion of the resistor can be U-shaped.

Figure 16:
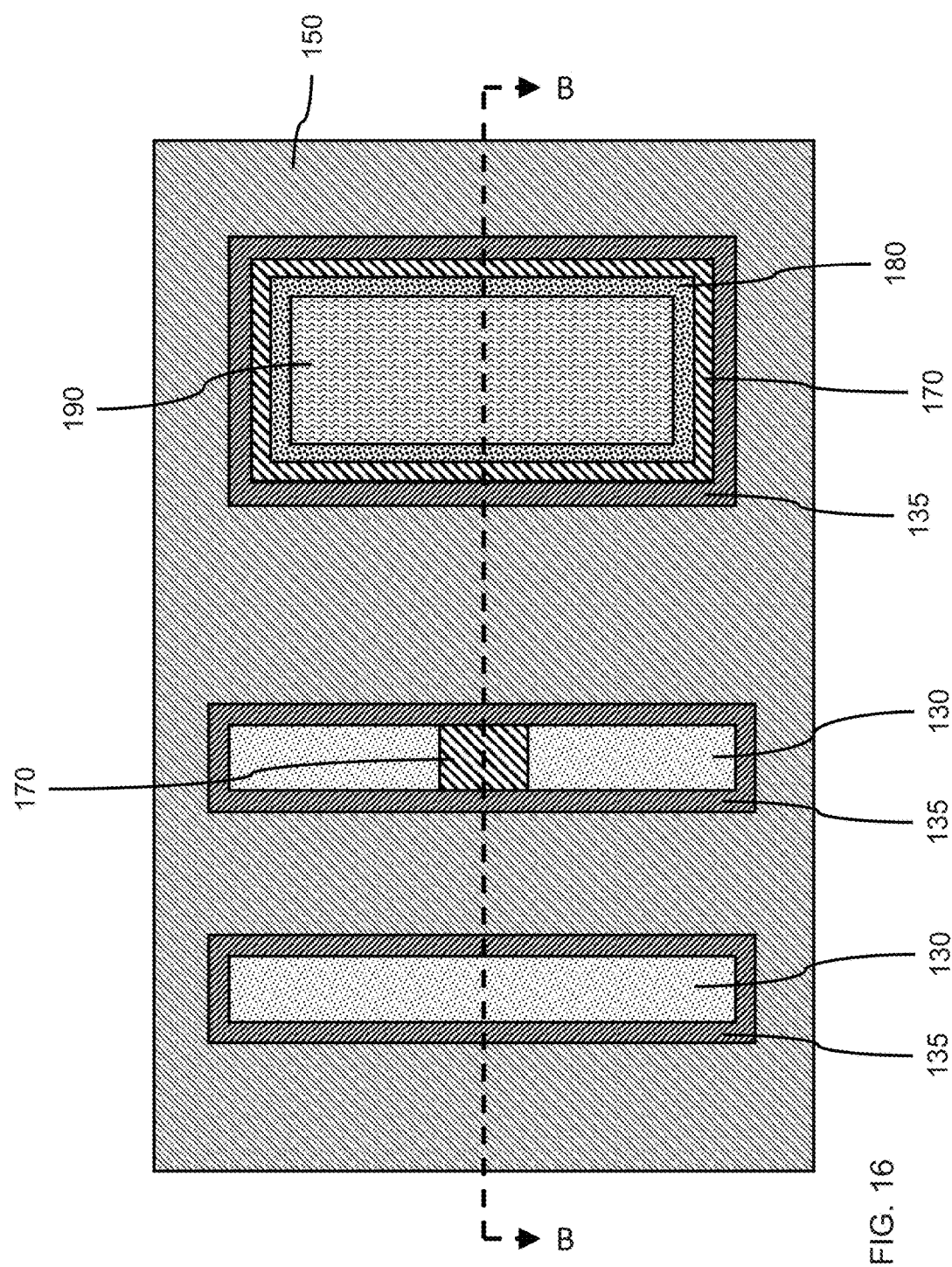
FIG. 16 is a top view showing the 3-dimensional resistor formed in the resistor trench, and the gate spacer in the gate opening, in accordance with an embodiment of the present invention.

FIG. 16 is a top view showing the 3-dimensional resistor formed in the resistor trench, and the gate spacer in the gate opening, in accordance with an embodiment of the present invention.

In one or more embodiments, the resistive portion of the resistor formed by resistor layer 180 can be electrically isolated from other portions and components of the device by the pinch-off layer 170 and the insulating fill layer 190.

In one or more embodiments, the pinch-off layer 170 separates the dummy gate structure into two segments, where each segment may be replaced with an individual functional gate structure on different vertical fins 111.

Figure 17:
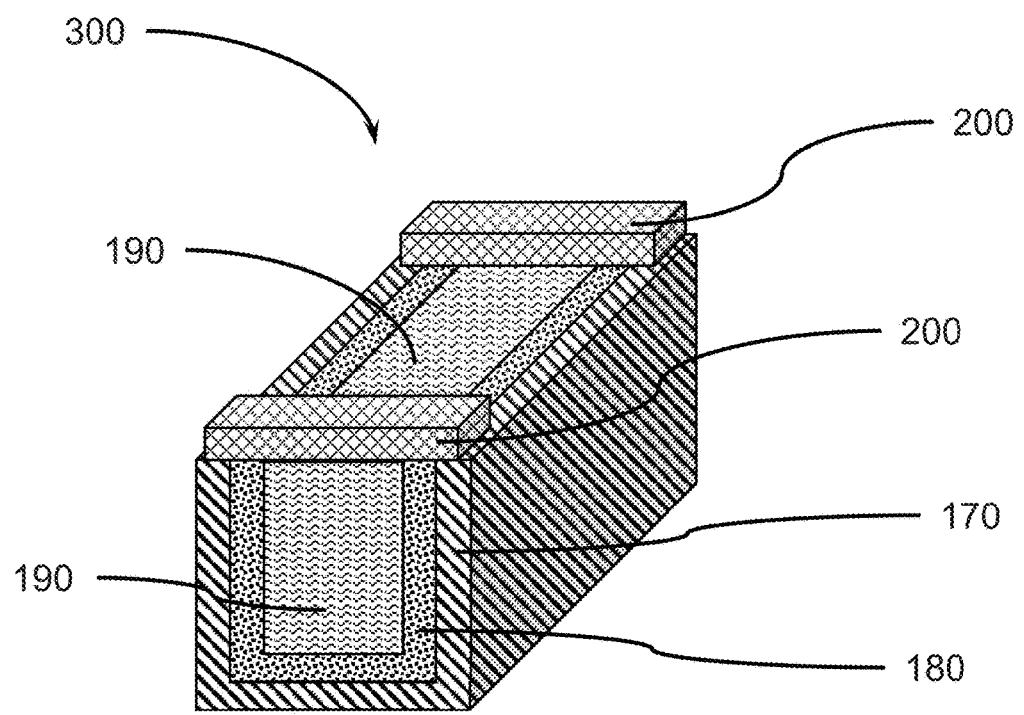
FIG. 17 is a cut-away perspective view showing a configuration of the 3-dimensional resistor with electrical contacts, in accordance with an embodiment of the present invention.

FIG. 17 is a cut-away perspective view showing a configuration of the 3-dimensional resistor with electrical contacts, in accordance with an embodiment of the present invention.

In one or more embodiments, electrical contacts 200 can be formed on opposite ends of the resistor layer 180, such that a current could flow from one electrical contact 200 to the other electrical contact through the resistor layer 180. The resistor 300 can be 3-dimensional, where the resistive portion can be U-shaped up and along the sidewall spacers covered by the pinch-off layer 170.

In one or more embodiments, the dummy gate structures can be replaced with functional gate structures including a gate dielectric layer, a gate fill layer, and optionally a work function layer.

In one or more embodiments, the gate dielectric layer may be an insulating dielectric layer, for example, a silicon oxide (SiO) or a high-K dielectric.

In various embodiments, the dielectric layer may be a high-K dielectric material that may include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$-$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb$(Sc_xTa_{1-x})O_3$), and lead zinc niobate (e.g., $PbZn_{1/3}Nb_{2/3}O_3$). The high-k material may further include dopants such as lanthanum and/or aluminum. The stoichiometry of the high-K compounds may vary.

In one or more embodiments, the gate dielectric layer may be formed on the sidewall spacers 135, for example, by a conformal deposition, for example, ALD, PEALD, CVD, PECVD, or combinations thereof.

In one or more embodiments, a work function layer may be formed on the gate dielectric layer. A work function layer may be formed on the exposed portion(s) of the gate dielectric layer. The work function layer may be formed on the gate dielectric layer to adjust the electrical properties of the gate electrode. In various embodiments, the work function layer may be optional.

In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer may be a TiN/TiC stack.

In one or more embodiments, the work function layer may be formed by a conformal deposition, for example, ALD, PEALD, CVD, PECVD, or combinations thereof. The work function layer may be formed by a directional ion deposition, for example, PVD or a gas cluster ion beam deposition (GCIB), where the work function layer may be formed on the exposed surfaces of the gate dielectric layer on the active vertical fin(s) 111. The work function layer may be at least partially etched back.

In various embodiments, the work function layer may have a thickness in the range of about 3 nm to about 11 nm, or may have a thickness in the range of about 5 nm to about 8 nm.

In one or more embodiments, a gate fill layer may be formed on the gate dielectric layer and/or work function layer if present, where the gate fill layer may fill in the remaining space(s) between sidewall spacers 135. The gate fill layer, gate dielectric layer, and optionally the work function layer, can form a gate structure on one or more active vertical fin(s) 111, where the gate fill layer and work function layer can form a conductive gate electrode.

In various embodiments, the gate fill layer may be blanket deposited on the exposed surfaces of the gate dielectric layer and/or work function layer on the vertical fin(s) 111. The gate fill layer material above the top surfaces may be removed by a CMP to provide a flat, uniform surface.

In various embodiments, the gate fill layer may be a conductive metal, where the metal may be tungsten (W), titanium (Ti), molybdenum (Mo), cobalt (Co), or a conductive carbon material (e.g., carbon nanotube, graphene, etc.), or any suitable combinations thereof.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a resistor adjacent to a fin field effect transistor on a substrate, comprising:
    forming a plurality of vertical fins on the substrate;
    forming a dielectric fill layer on the plurality of vertical fins and a region of the substrate unoccupied by the plurality of vertical fins;
    forming a replaceable resistor structure on the dielectric fill layer over the unoccupied region of the substrate;
    forming a first sidewall spacer on the replaceable resistor structure;
    removing the replaceable resistor structure to form a resistor trench; and
    forming a pinch-off layer in the resistor trench.

2. The method of claim 1, wherein the sidewall spacer is selected from the group consisting of silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), and combinations thereof.

3. The method of claim 2, wherein a portion of the pinch-off layer is formed on the dielectric fill layer, and another portion of the pinch-off layer fills a dummy gate trench between a second sidewall spacer and a third sidewall spacer.

4. The method of claim 3, further comprising, forming a resistor layer on the pinch-off layer, and forming an insulating fill layer on the resistor layer.

5. The method of claim 4, where the resistor layer is tungsten silicide (WSi), tungsten (W), titanium nitride (TiN), or combinations thereof.

6. The method of claim 4, wherein the pinch-off layer has a thickness in a range of about 5 nm to about 20 nm, and the distance between the second sidewall spacer and the third sidewall spacer is less than twice the thickness of the pinch-off layer.

7. The method of claim 6, wherein the resistor layer has a thickness in a range of about 5 nm to about 30 nm.

8. The method of claim 1, wherein the plurality of vertical fins are formed by a sidewall image transfer process.

9. A method of forming a resistor and fin field effect transistor on a region of a substrate, comprising:
    forming a plurality of vertical fins on the substrate;
    fowling a dielectric fill layer on the plurality of vertical fins;
    forming a dummy gate structure across the plurality of vertical fins;
    forming a replaceable resistor structure on the dielectric fill layer, wherein the replaceable resistor structure is above the top surface of the plurality of vertical fins;
    forming a sidewall spacer on each sidewall of the dummy gate structure and the replaceable resistor structure;
    fainting an interlayer dielectric (ILD) layer on the sidewall spacer on each sidewall of the dummy gate structure and the replaceable resistor structure, where the ILD layer fills in spaces between the sidewall spacers;
    removing the replaceable resistor structure and the dummy gate structure to form a resistor trench and a dummy gate trench;
    forming a pinch-off layer on the exposed sidewalls of the sidewall spacers and a portion of the dielectric fill layer, wherein the pinch-off layer fills the dummy gate trench;
    forming a resistor layer on the pinch-off layer; and
    forming an insulating fill layer on the resistor layer.

10. The method of claim 9, wherein the resistor layer is tungsten silicide (WSi), tungsten (W), titanium nitride (TiN), or combinations thereof.

11. The method of claim 9, wherein the resistor layer has a thickness in the range of about 5 nm to about 30 nm.

12. The method of claim 9, wherein the pinch-off layer has a thickness in a range of about 5 nm to about 20 nm.

13. The method of claim 12, wherein the pinch-off layer has a thickness in the range of about 8 nm to about 15 nm, and the dummy gate trench has a width of twice the pinch-off layer thickness or less.

14. The method of claim 13, wherein the resistor layer is on the vertical portions of the pinch-off layer, wherein the resistor layer is U-shaped.

15. A method of forming a resistor on a substrate, comprising:
    forming a dielectric fill layer on the substrate;
    forming a replaceable resistor structure on the dielectric fill layer;
    forming a sidewall spacer surrounding the replaceable resistor structure;
    removing the replaceable resistor structure to expose the underlying dielectric fill layer;
    forming a pinch-off layer on the sidewall spacer and exposed dielectric fill layer;
    forming a resistor layer on the pinch-off layer, wherein the resistor layer is U-shaped; and
    forming an insulating fill layer on the resistor layer.

16. The resistor of claim 15, wherein the pinch-off layer has a thickness in the range of about 5 nm to about 20 nm.

17. The resistor of claim 15, wherein the resistor layer has a thickness in the range of about 10 nm to about 20 nm.

18. The resistor of claim 17, further comprising forming an electrical contact on opposite ends of the U-shaped resistor layer.

19. The resistor of claim 17, further comprising removing portions of the insulating fill layer, resistor layer, and pinch-off layer, above the surface of the sidewall spacers using chemical-mechanical polishing.

20. The resistor of claim 17, wherein the resistor layer is tungsten silicide (WSi), tungsten (W), titanium nitride (TiN), or combinations thereof, and the insulating fill layer is silicon nitride (SiN), silicon oxynitride (SiON) or silicon oxycarbide (SiOC).

* * * * *